United States Patent
Ernst et al.

(10) Patent No.: US 11,862,779 B2
(45) Date of Patent: Jan. 2, 2024

(54) WASTE HEAT RECOVERY POWER ELECTRONICS COOLING

(71) Applicant: Cummins Inc., Columbus, IN (US)

(72) Inventors: Timothy C. Ernst, Columbus, IN (US); Jonathan A. Dickson, Columbus, IN (US); Manik Narula, Columbus, IN (US)

(73) Assignee: Cummins Inc., Columbus, IN (US)

( * ) Notice: Subject to any disclaimer, the term of this patent is extended or adjusted under 35 U.S.C. 154(b) by 336 days.

(21) Appl. No.: 17/224,523

(22) Filed: Apr. 7, 2021

(65) Prior Publication Data

US 2021/0305644 A1 Sep. 30, 2021

Related U.S. Application Data

(63) Continuation of application No. PCT/US2019/057996, filed on Oct. 25, 2019.

(Continued)

(51) Int. Cl.
| | |
|---|---|
| *H01M 10/66* | (2014.01) |
| *H01M 10/613* | (2014.01) |
| *H01M 10/625* | (2014.01) |
| *H01M 10/635* | (2014.01) |
| *H01M 10/6568* | (2014.01) |

(Continued)

(52) U.S. Cl.
CPC ........ *H01M 10/66* (2015.04); *B60H 1/00278* (2013.01); *B60H 1/00392* (2013.01); *B60L 58/26* (2019.02); *H01M 10/613* (2015.04); *H01M 10/625* (2015.04); *H01M 10/635* (2015.04); *H01M 10/6568* (2015.04); *H05K 7/20263* (2013.01); *H05K 7/20272* (2013.01);

(Continued)

(58) Field of Classification Search
CPC .. H01M 10/66; H01M 10/613; H01M 10/625; H01M 10/635; H01M 10/6568; H01M 2220/20; B60H 1/00278; B60H 1/00392; B60L 58/26; H05K 7/20263; H05K 7/202702; H05K 7/20927; Y02T 10/70; Y02E 60/10
USPC .......... 701/22; 123/41.01, 41.2, 41.31, 41.44
See application file for complete search history.

(56) References Cited

U.S. PATENT DOCUMENTS

| | | |
|---|---|---|
| 8,082,894 B2 | 12/2011 | Poschl et al. |
| 9,560,790 B2 | 1/2017 | Joshi et al. |

(Continued)

FOREIGN PATENT DOCUMENTS

| | | |
|---|---|---|
| DE | 102012208992 A1 | 12/2013 |
| EP | 1126142 A2 | 2/2001 |
| EP | 1108572 B1 | 10/2005 |

OTHER PUBLICATIONS

1 Search Report and Written Opinion, PCT Appln. No. PCT/US19/57996, dated May 22, 2020, 14 pgs.

*Primary Examiner* — Hai H Huynh
(74) *Attorney, Agent, or Firm* — Taft, Stettinius & Hollister LLP

(57) ABSTRACT

A cooling system for an electrified vehicle includes a first cooling loop for circulating coolant for cooling at least one of power electronics and a motor/generator of the vehicle. The first coolant loop includes a heat exchanger for exchanging heat with the coolant in the first cooling loop. A second cooling loop is provided for circulating coolant for cooling a battery of the vehicle. The second cooling loop includes a coolant chiller connected to a refrigeration system of the vehicle for exchanging heat in the coolant received from the battery with the refrigeration system of the vehicle.

20 Claims, 7 Drawing Sheets

Related U.S. Application Data

(60) Provisional application No. 62/756,729, filed on Nov. 7, 2018.

(51) Int. Cl.
  *B60L 58/26* (2019.01)
  *B60H 1/00* (2006.01)
  *H05K 7/20* (2006.01)

(52) U.S. Cl.
  CPC ..... *H05K 7/20927* (2013.01); *H01M 2220/20* (2013.01)

(56) References Cited

U.S. PATENT DOCUMENTS

| | | |
|---|---|---|
| 9,810,129 B2 | 11/2017 | Zhou et al. |
| 2002/0043413 A1 | 4/2002 | Kimishima et al. |
| 2013/0286591 A1 | 10/2013 | Myers et al. |
| 2015/0034272 A1 | 2/2015 | Saab et al. |
| 2016/0107501 A1 | 4/2016 | Johnston |
| 2017/0044969 A1 | 2/2017 | Bruemmer |
| 2017/0120725 A1 | 5/2017 | Zhou et al. |
| 2017/0253105 A1 | 9/2017 | Allgaeuer et al. |

WASTE HEAT RECOVERY POWER ELECTRONICS COOLING

CROSS-REFERENCE TO RELATED APPLICATION

The present application is a continuation of International Patent Application No. PCT/US19/57996 filed on Oct. 25, 2019, which claims the benefit of the filing date of U.S. Provisional Application Ser. No. 62/756,729 filed on Nov. 7, 2018, each of which is incorporated herein by reference.

STATEMENT REGARDING GOVERNMENT RIGHTS

This invention was made with government support under DE-EE0007761 awarded by the Department of Energy. The government has certain rights in this invention.

BACKGROUND

The present application relates to apparatuses, methods, systems, and techniques for determining and adjusting cooling systems for electrified powertrains, mild hybrid powertrains, and strong hybrid powertrains to manage temperature conditions of one or more of their electronic components. Under some operating conditions, the motor/generator and power electronics of such powertrains can tolerate sufficiently warm temperatures such that temperature conditioning with a working fluid near ambient is sufficient. Batteries, however, require temperature conditioning below normal ambient operating temperatures for roughly half of the operating time. Thus, there remains a substantial need for the unique apparatuses, methods, systems, and techniques disclosed herein.

DISCLOSURE OF ILLUSTRATIVE EMBODIMENTS

For the purposes of clearly, concisely and exactly describing illustrative embodiments of the present disclosure, the manner, and process of making and using the same, and to enable the practice, making and use of the same, reference will now be made to certain exemplary embodiments, including those illustrated in the figures, and specific language will be used to describe the same. It shall nevertheless be understood that no limitation of the scope of the invention is thereby created and that the invention includes and protects such alterations, modifications, and further applications of the exemplary embodiments as would occur to one skilled in the art.

SUMMARY OF THE DISCLOSURE

Exemplary embodiments include unique apparatus, methods, systems and techniques for cooling electrified powertrains, mild hybrid powertrains, and strong hybrid powertrains to manage a temperature condition of one or more electronic components in their system. Further embodiments, forms, objects, features, advantages, aspects, and benefits shall become apparent from the following description and drawings.

DETAILED DESCRIPTION OF ILLUSTRATIVE EMBODIMENTS

The various cooling systems disclosed herein include arrangements in which certain electronic components can be cooled using separate cooling loops for improved efficiency. For example, in order to reduce the chiller energy consumption to improve system efficiency, the batteries can have a separate coolant loop than the motor/generator and power electronics during higher ambient conditions.

Figure 1:
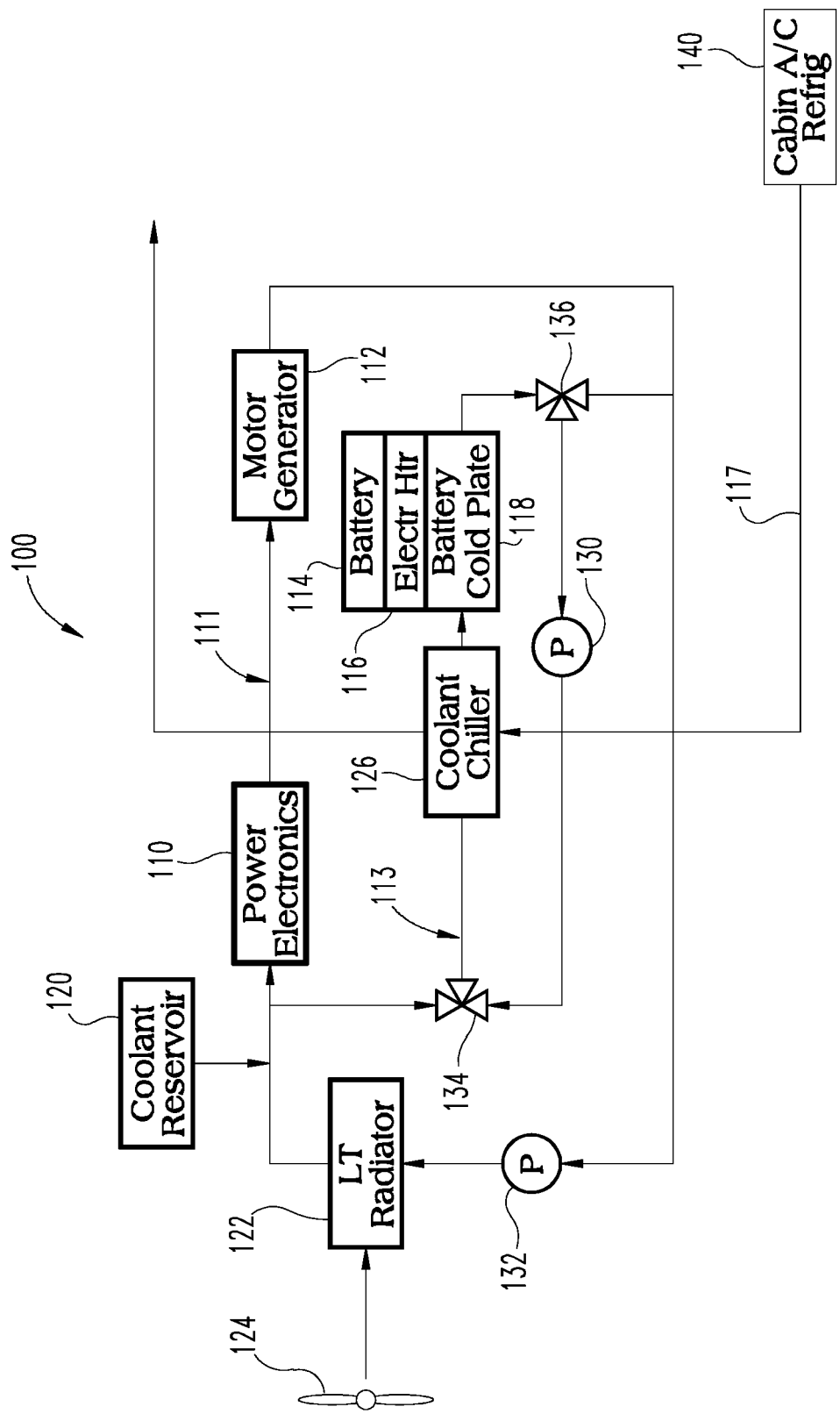
FIG. 1 is a schematic illustration of one embodiment of an exemplary cooling system for electronic components of an electrified powertrain.

With reference to FIG. 1, there is illustrated a schematic depiction an exemplary cooling system 100 including coolant reservoir 120 providing coolant to an outer coolant loop 111, and a fan 124 operable to provide cooling air to low temperature radiator 122. Low temperature radiator 122 lowers the temperature of the coolant in outer coolant loop 111 and, in certain operating conditions, of the coolant in an inner coolant loop 113. Outer coolant loop 111 provides the lower temperature coolant from low temperature radiator 122 to power electronics 110 and to a motor/generator 112 downstream from power electronics 110. The heat from power electronics 110 and motor/generator 112 is transferred to the coolant in outer coolant loop 111 and provided to pump 132 downstream from motor generator 112 for circulation through low temperature radiator 122 to lower the coolant temperature.

Inner coolant loop 113 is flow connected with outer coolant loop 111 via a first three-way valve 134 and a second three-way valve 136. In certain lower ambient temperature conditions, coolant from low temperature radiator 122 is provided to inner coolant loop 113 from outer coolant loop 111 through first three-way valve 134 for circulation through coolant chiller 126 and battery cold plate 118, and then the coolant that is heated by the battery 114 is returned to outer loop 111 through second three-way valve 136. Although the discussion herein references a battery specifically, any suitable energy storage device for an electrified powertrain is contemplated as may be known in the art.

Inner loop 113 can be flow isolated from outer coolant loop 111 in high ambient temperature conditions using three-way valves 134, 136 and the coolant is circulated within the closed inner loop 113 using the second coolant pump 130. The coolant chiller 126 is connected with the cabin A/C refrigerant loop 140, which is fluidly isolated from but in thermal communication with the coolant in inner coolant loop 113 within coolant chiller 126. Inner coolant loop 113 provides coolant to battery cold plate 118 downstream from coolant chiller 126 that is cooled by the A/C refrigerant loop 140 during higher temperature ambient conditions. The battery cold plate 118 may be thermally coupled to battery 114 with an electric heater 116 therebetween, although any suitable battery arrangement is contemplated.

Figure 2:
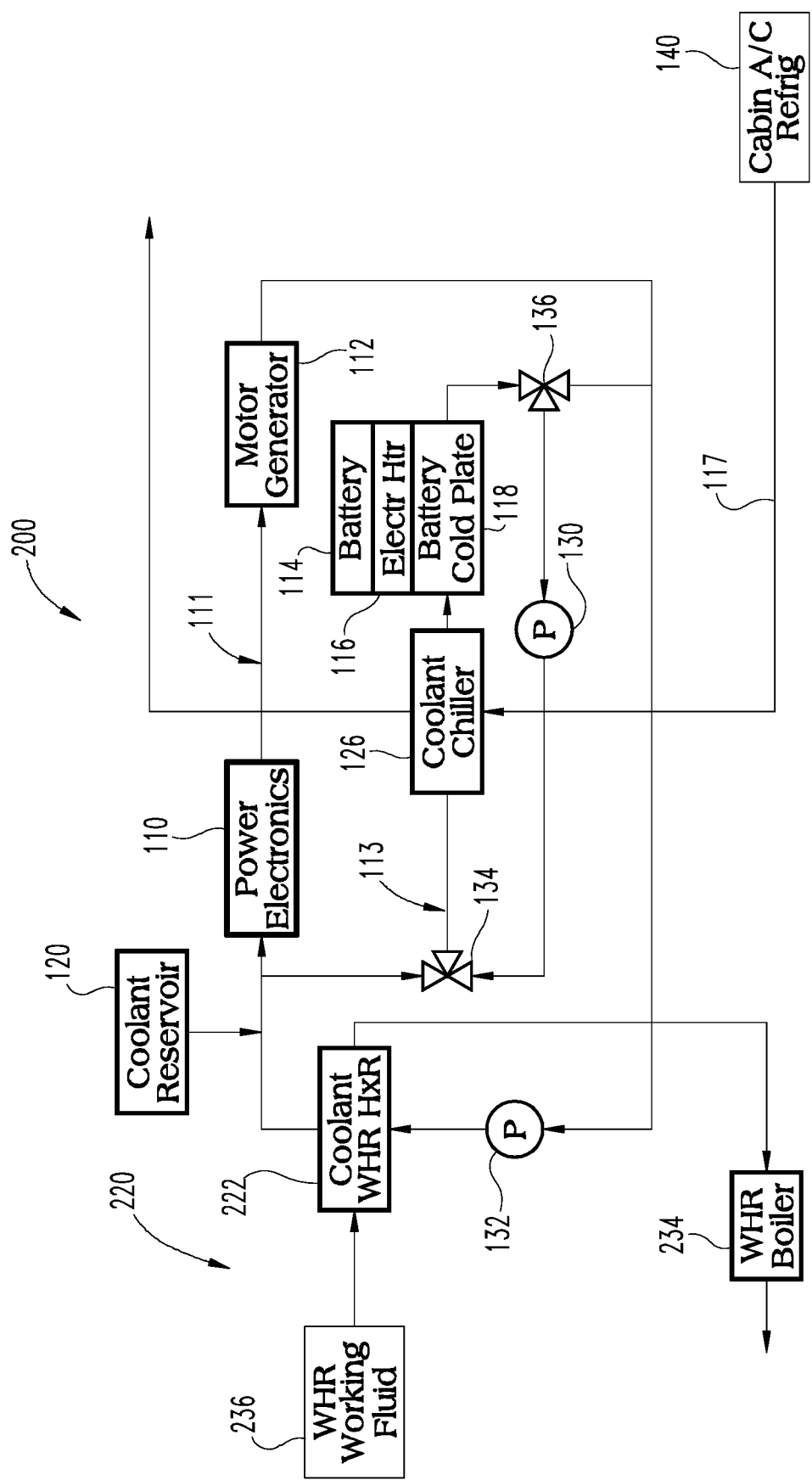
FIG. 2 is a schematic illustration of another embodiment cooling system.

With reference to FIG. 2, there is illustrated a schematic depiction of certain portions of another embodiment cooling system 200 that is similar to cooling system 100 except that the low temperature radiator 122 is replaced with a waste heat recovery system (WHR) 220. WHR system 220 includes a WHR working fluid 236 that is circulated through a WHR heat exchanger 222 and WHR boiler 234 downstream from WHR heat exchanger 222. The working fluid 236 is isolated from but in thermal communication with the coolant in the outer coolant loop 111 inside of WHR heat exchanger 222. The WHR heat exchanger 222 receives the heat from the coolant in outer coolant loop 111 and, in certain low ambient temperature operating conditions, the inner coolant loop 213 to provide a lower temperature coolant for circulation through power electronics 110 and motor/generator 112 and battery 114.

WHR heat exchanger 222 does not provide lower temperature coolant to inner coolant loop 113 during higher ambient temperature conditions. Rather, the coolant in inner loop 113 is flow isolated from outer loop 111 as discussed above, and the coolant is circulated within inner loop 113 and cooled with cabin A/C refrigerant circulated through coolant chiller 126

Figure 3:
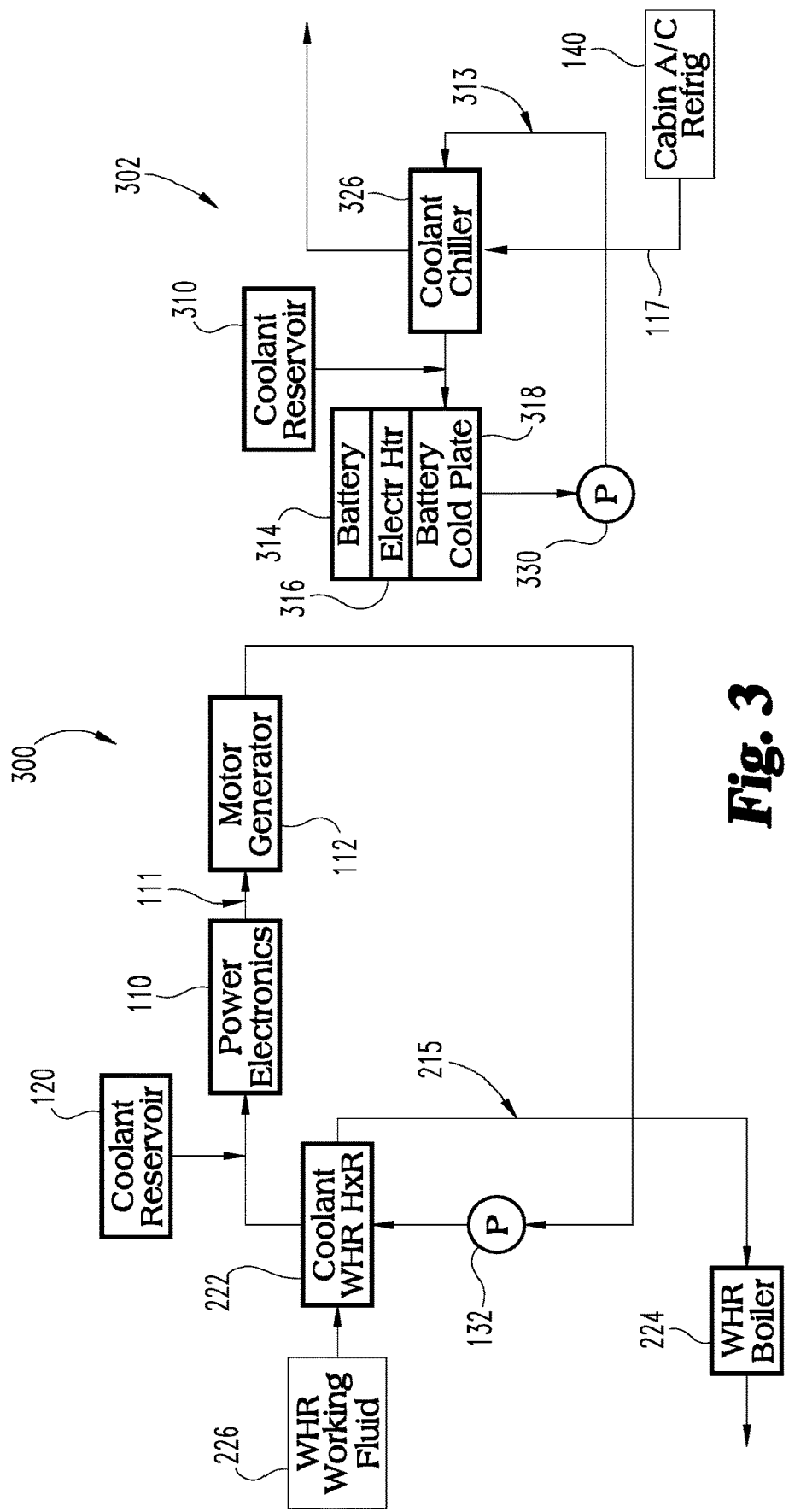
FIG. 3 is a schematic illustration of another embodiment cooling system.

With reference to FIG. 3, there is illustrated another embodiment cooling system 300 that is similar to cooling system 200 except that a second coolant loop 313 is provided as a separate cooling system 302 that does not share coolant with outer coolant loop 111 under any operating conditions. The cooling system 302 includes a first coolant reservoir 310 providing coolant to second coolant loop 313.

The second coolant loop 313 is provided with coolant from second coolant reservoir 310. Second coolant loop 313 provides coolant to battery cold plate 318. Battery cold plate 318 is thermally coupled to battery 314 with electric heater 316 therebetween. Second coolant loop 313 then provides coolant heated from the battery 314 to a second pump 330 downstream from battery cold plate 318. Second pump 330 circulates the heated coolant to coolant chiller 326 downstream from second pump 330. Cabin A/C refrigerant 140 is provided to coolant chiller 326 through cabin A/C refrigerant loop 117 to cool the heated coolant before it is circulated back to the battery cold plate 318. In this embodiment, the cabin A/C refrigerant provides all the cooling for battery 314, whereas in the embodiments of FIGS. 1 and 2 the cabin A/C refrigerant only provides cooling of the battery during higher temperature ambient conditions.

Figure 4:
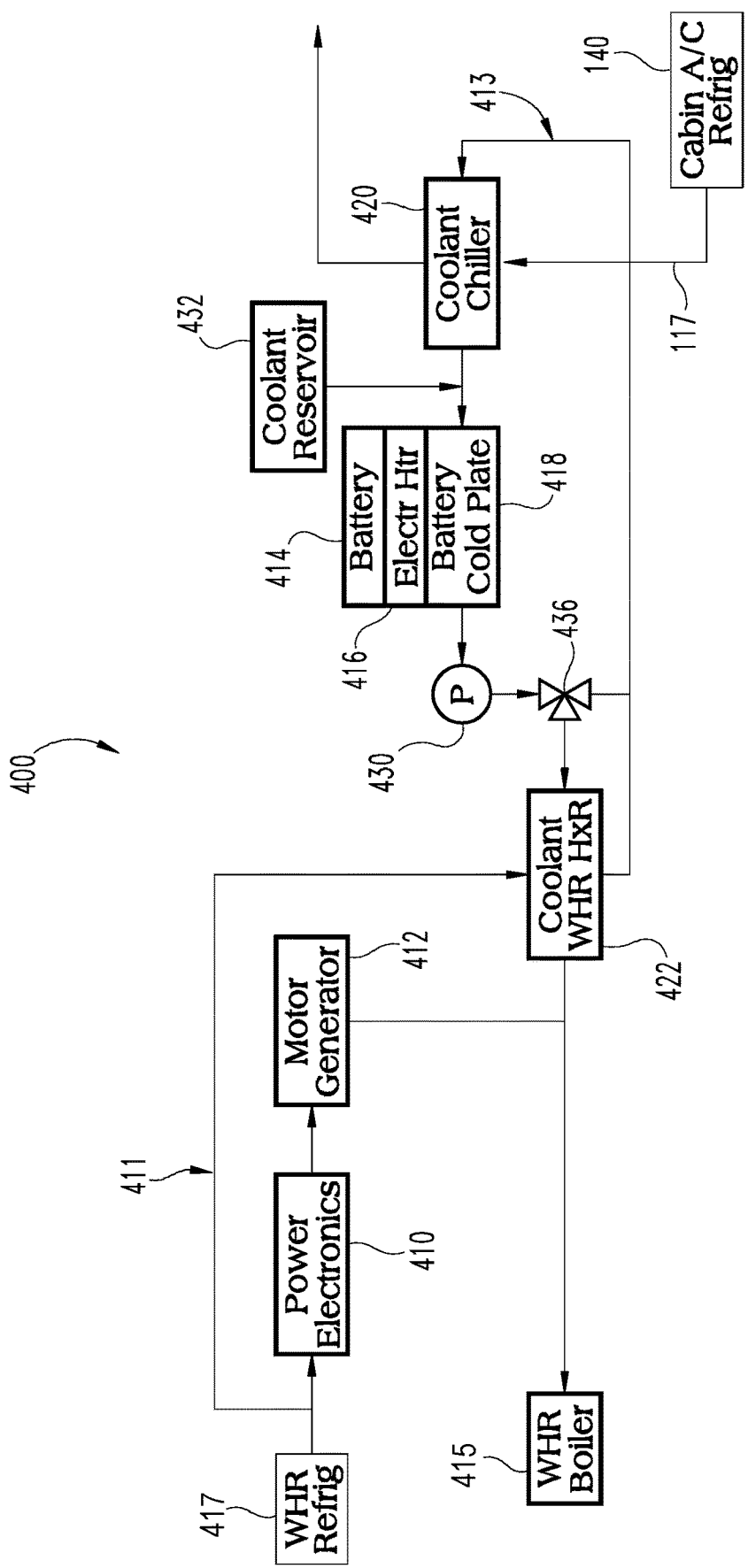
FIG. 4 is a schematic illustration of another embodiment cooling system.

With reference to FIG. 4, there is illustrated a schematic depiction of another embodiment cooling system 400 including WHR refrigerant 417 feeding coolant to a first coolant loop 411. The first coolant loop 411 provides coolant for cooling of power electronics 410 and motor/generator 412, and the heated coolant is circulated through WHR heat exchanger 422. The heated working fluid from WHR heat exchanger 422 is circulated WHR boiler 415.

Cooling system 400 also includes a second coolant loop 413. Second coolant loop 413 includes a pump 430 that circulates coolant heated by battery 414 for cooling by coolant WHR heat exchanger 422 during lower temperature ambient conditions. Second coolant loop 413 circulates coolant from WHR heat exchanger 422 to coolant chiller 426 and then to battery cold plate 418 which is thermally coupled to battery 414 with electric heater 416 therebetween.

Depending on the position of three-way valve 436, pump 430 circulates coolant to either coolant WHR heat exchanger 422 during a low temperature ambient condition, or for recirculation within second coolant loop 413 (bypassing WHR exchanger 422) during high temperature ambient conditions. During lower temperature ambient conditions, the coolant in second coolant loop 413 is circulated through coolant WHR heat exchanger 422 to lower the temperature of the coolant. During the high temperature ambient conditions, the cabin A/C refrigerant 140 is provided to coolant chiller 426 via the cabin A/C refrigerant loop 117, which is isolated from second coolant loop 413, in order to cool the coolant in the second coolant loop 413.

Figure 5:
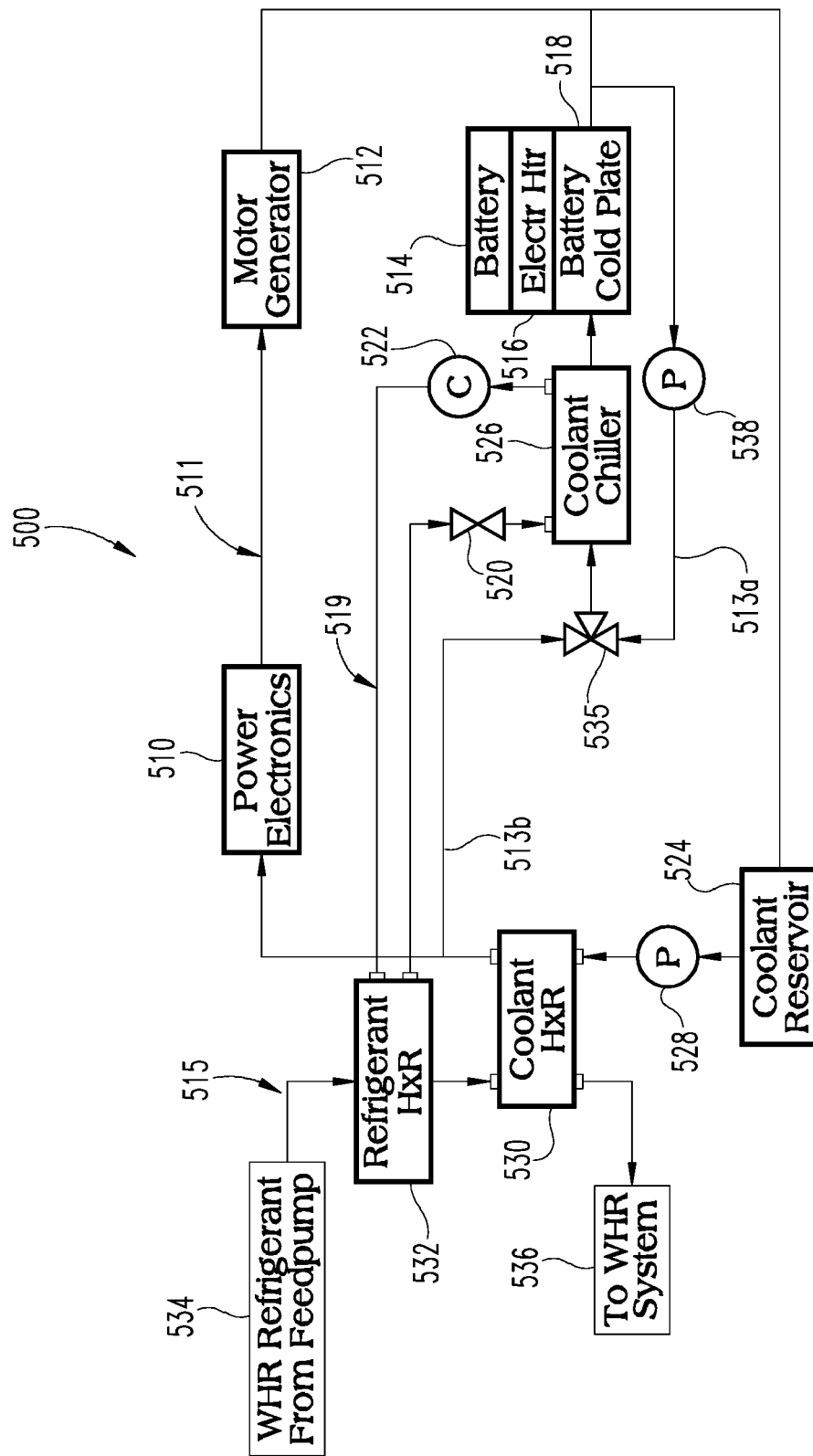
FIG. 5 is a schematic illustration of another embodiment cooling system.

With reference to FIG. 5, there is illustrated another embodiment cooling system 500 including WHR refrigerant 534 provided from, for example, a feed-pump (not shown). The WHR refrigerant 534 is provided to WHR refrigerant loop 515, which provides refrigerant to refrigerant heat exchanger 532 to exchange heat with the coolant from coolant chiller 526 during certain operating conditions. Refrigerant coolant loop 515 then provides refrigerant to coolant heat exchanger 530 downstream from refrigerant heat exchanger 532. Refrigerant loop 515 then provides refrigerant to WHR system 536 downstream from coolant heat exchanger 530. In one embodiment, the WHR system 536, and the WHR systems of FIGS. 2-4, is an Organic Rankine Cycle WHR system.

Coolant reservoir 524 provides coolant to first coolant loop 511. First coolant loop 511 includes a first pump 528 which circulates coolant through coolant heat exchanger 530, power electronics 510, and motor/generator 512. The coolant in first coolant loop 511 is isolated from but in thermal communication with the WHR refrigerant in refrigerant loop 515 within coolant heat exchanger 530.

First coolant loop 511 also provides coolant to three-way valve 535 that is located between a first portion 513a and a second portion 513b of a second coolant loop 513 downstream from coolant heat exchanger 530. As discussed below, the positioning of three-way valve 535 can be used to control whether the coolant from first loop 511 is circulated in second coolant loop 513 to receive heat from the battery 514 and returned to first coolant loop 511, or is circulated in a closed loop within second coolant loop 513 formed in part by second portion 513b for a heat exchange with refrigerant circulated in a third coolant loop 519.

Figure 6:
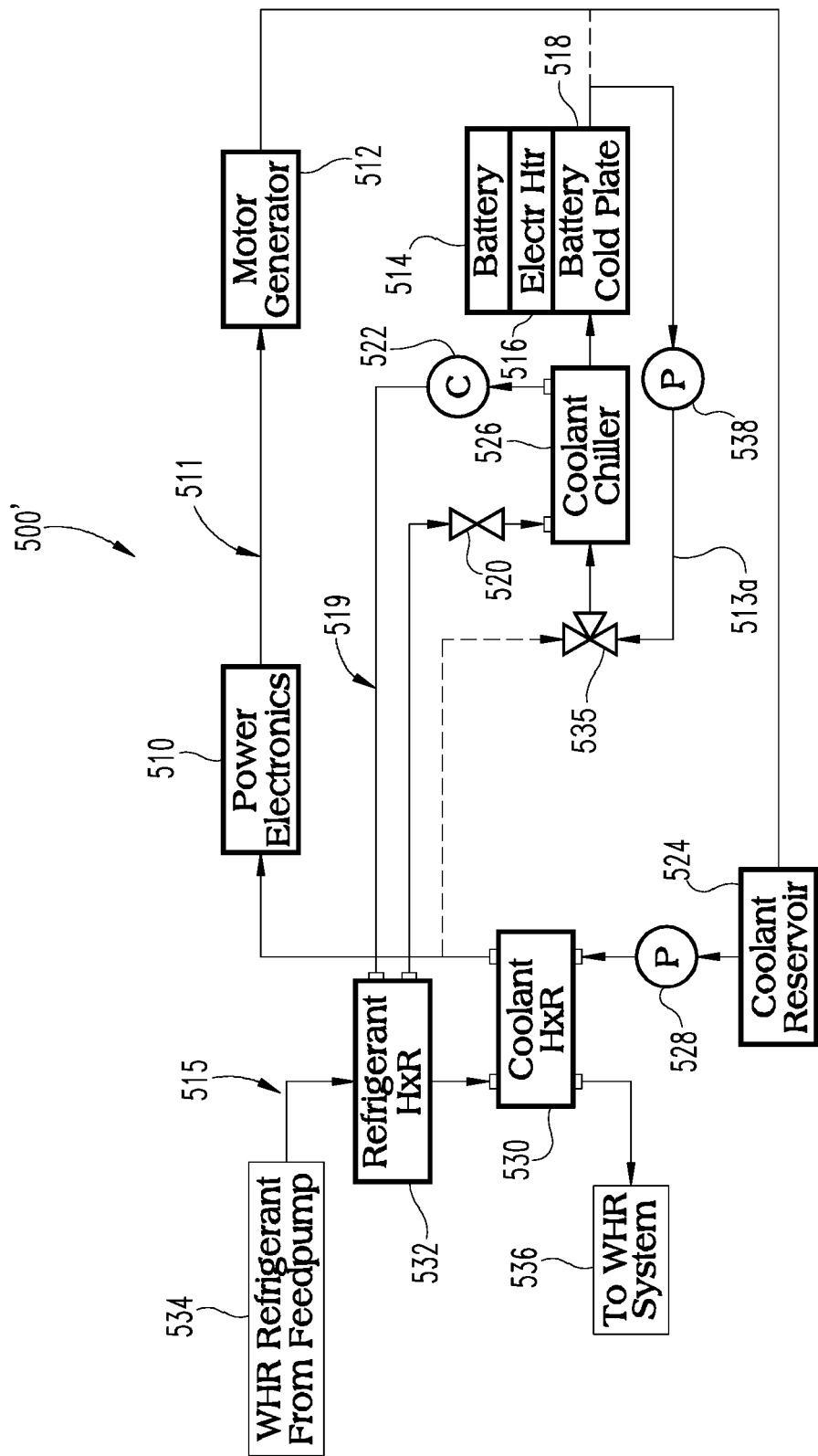
FIG. 6 is a schematic illustration of the cooling system of FIG. 5 during high temperature ambient conditions.

The third coolant loop 519 provides a coolant flow path from coolant chiller 526 to refrigerant heat exchanger 532 under certain operating conditions. For example, as shown in FIG. 6, the modified cooling system 500' is shown with active flow paths during a hot or higher temperature ambient temperature condition. In cooling system 500' the three-way valve 535 and two-way valve 520 are positioned so that a first coolant or refrigerant is circulated through third coolant loop 519 and coolant chiller 526, and that the coolant from first loop 511 is recirculated through coolant chiller 526 with pump 538 in a closed loop formed by second portion 513a of the second coolant loop 513. The first coolant loop 511 is thus isolated from the third coolant loop 519 from providing coolant for cooling the battery 514, which may include cold plate 516 and heater 518. The refrigerant or coolant in third coolant loop 519 receives the heat from the battery 514 via a heat exchange in coolant chiller 526, and can be compressed with compressor 522 in a vapor compression cycle before being returned to refrigerant heat exchanger 532.

Figure 7:
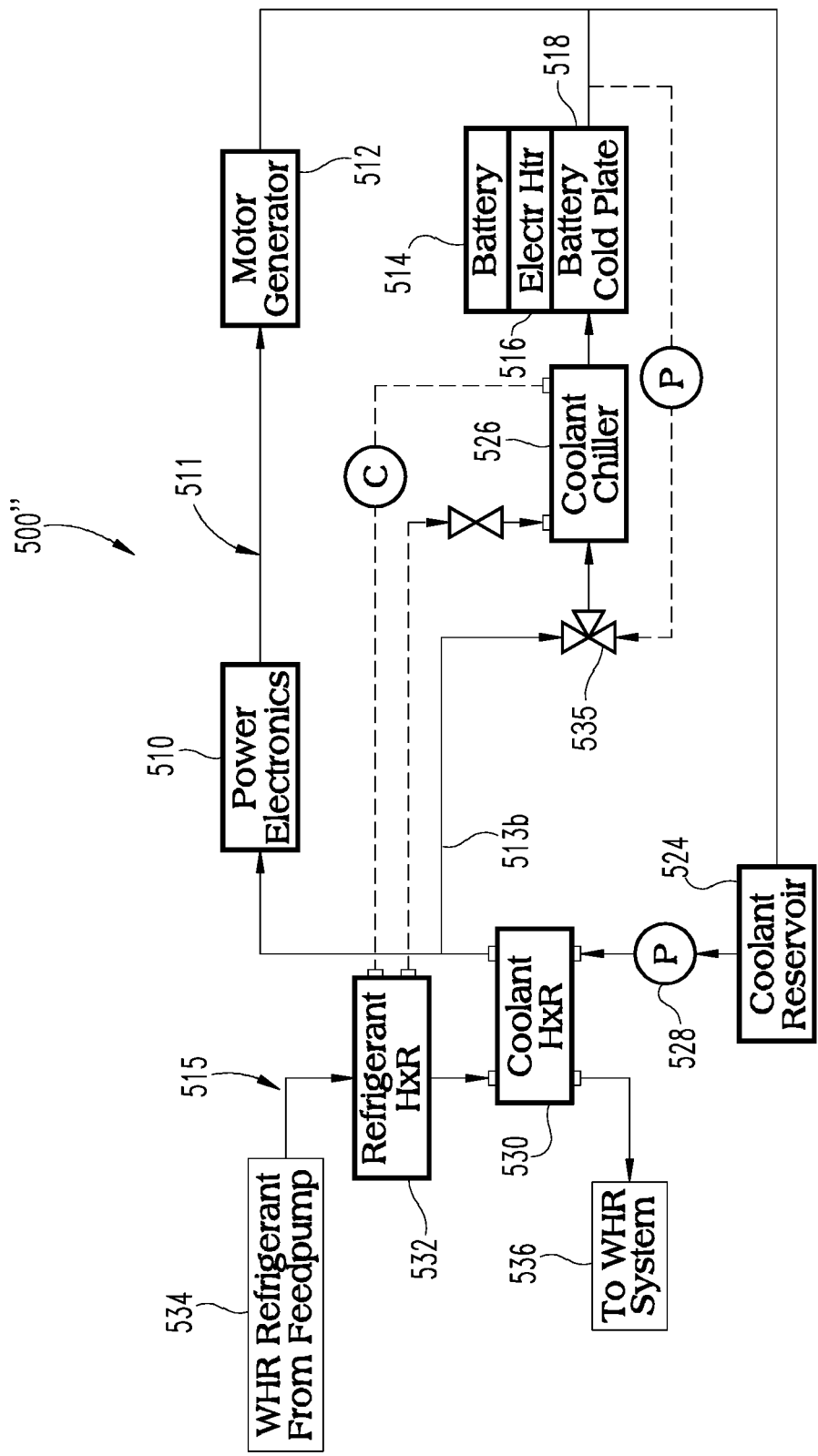
FIG. 7 is a schematic illustration of the cooling system of FIG. 5 during low temperature ambient conditions.

With reference to FIG. 7, there is illustrated the active coolant flow paths of the cooling system 500 during a lower ambient temperature operation, as indicated by cooling system 500". In FIG. 7 the two-way valve 520 is closed to prevent circulation through third coolant loop 519, and the three-way valve 535 is positioned so that coolant from first coolant loop 511 is circulated through coolant chiller 526 and to receive heat from battery 514 and back into first coolant loop 511. The heat from battery 514 is transferred to the coolant and returned to coolant heat exchanger 530 during this operating condition, rather than being returned to the refrigerant heat exchanger 532 through the refrigerant in third loop 519 as occurs in the FIG. 6 operation.

With reference to the embodiments in FIGS. 1 and 2 the chiller energy consumption may be improved by flow isolating the second or inner coolant loop 113 for the batteries from the first or outer coolant loop 111 for the motor/generator 112 and power electronics 114 during higher temperature ambient conditions. The inner coolant loop 113 is isolated by utilizing the three-way valves 134, 136 and pump 130 to segregate the cooling of battery 114 during warmer ambient temperature conditions. In the FIG. 3 embodiment, a separate second low temperature (lower coolant temperature for cooling) loop 313 for the battery 314 cooling is utilized with a separate first high temperature (higher coolant temperature for cooling) loop 111 for power electronics 110 and motor/generator 112. This embodiment may have the benefit of reducing the overall coolant chiller 326 load from the high temperature loop 111, but relies exclusively on the coolant chiller 326 for the low temperature loop 313 even during cooler ambient conditions.

FIGS. 2, 3, 4, and 5 illustrate embodiments with the usage of a WHR system. The WHR working fluid 236, 417, 534 out of the WHR heat exchanger provides a near ambient temperature heat sink within coolant WHR heat exchanger 222, 422, 532 that can be utilized without the need to integrate a separate low temperature radiator.

With reference to the embodiments of FIGS. 1, 2, 3, 4 the cabin A/C refrigerant 140 is utilized to cool the areas requiring lower temperature cooling, like the batteries 114, 314, 414. These embodiments may be modified to include a separate vapor compression cycle like cooling system 500 to transfer heat from the battery cooling loop to another cooling loop which is either a WHR working fluid loop or a refrigerant coolant loop, particularly when the ambient temperature is too high for direct cooling with the WHR working fluid 534 or low temperature coolant.

According to one aspect of the present disclosure, a cooling system for an electrified vehicle includes a first cooling loop and a second cooling loop. The first cooling loop circulates coolant for cooling at least one of power electronics and a motor/generator of the vehicle. The first cooling loop includes a heat exchanger for exchanging heat with the coolant in the first cooling loop. The second cooling loop circulates coolant for cooling an energy storage device of the vehicle. The second cooling loop includes a coolant chiller connected to a refrigeration system of the vehicle for exchanging heat in the coolant received from the energy storage device with the refrigeration system of the vehicle.

In one embodiment, the heat exchanger is a radiator. In one embodiment, at least one of the first and second cooling loops includes a pump for circulating coolant. In one embodiment, each of the first and second cooling loops includes a pump for circulating coolant. In one embodiment, the refrigeration system is part of a cabin refrigeration system for the vehicle.

In one embodiment, the heat exchanger is part of a WHR system of the vehicle. In one embodiment, the second cooling loop is connected to the first cooling loop with a flow control valve, and the flow control valve is positionable to isolate the coolant in the second cooling loop in response to a first ambient temperature condition, and the flow control valve is positionable to allow coolant flow from the second cooling loop to the first cooling loop in response to a second ambient temperature condition.

In one embodiment, the second cooling loop is completely separate from the first cooling loop. In one embodiment, the coolant in the first cooling loop is in thermal communication with a WHR refrigerant from the WHR system. In one embodiment, the refrigeration system is part of the WHR system and includes a refrigerant heat exchanger and the coolant chiller is connected to the refrigerant heat exchanger with a third cooling loop.

In one embodiment, the third cooling loop includes a compressor for compressing refrigerant from the coolant chiller. In one embodiment, the third cooling loop includes a flow control valve to selectively allow circulation of refrigerant in the third cooling loop in response to an ambient temperature condition greater than a threshold.

In one embodiment, the second cooling loop is connected to the first cooling loop with a second flow control valve, and the second flow control valve is positionable to isolate the coolant in the second cooling loop in response to the ambient temperature condition being greater than the threshold for recirculation of the coolant in the second cooling loop, and the second flow control valve is positionable to allow coolant flow from the first cooling loop, through the second cooling loop and the coolant chiller, and back to the first cooling loop in response to the ambient temperature condition being less than the threshold.

According to another aspect, a method for operating an electrified vehicle cooling system includes: circulating coolant in a first cooling loop to cool at least one of power electronics and a motor/generator of the vehicle, where the first cooling loop includes a heat exchanger for exchanging heat with the coolant in the first cooling loop; and circulating coolant in a second cooling loop to cool an energy storage device of the vehicle, where the second cooling loop includes a coolant chiller connected to a refrigeration system of the vehicle for exchanging heat in the coolant received from the energy storage device with the refrigeration system of the vehicle.

In one embodiment, the method includes positioning a flow control valve that connects the second cooling loop to the first cooling loop to isolate the coolant in the second cooling loop in response to a first ambient temperature condition; and positioning the flow control valve to allow coolant flow from the second cooling loop to the first cooling loop in response to a second ambient temperature condition.

In one embodiment, the second cooling loop is completely separate from the first cooling loop, and the coolant in the first cooling loop is in thermal communication with a WHR refrigerant from a WHR system of the vehicle. In one embodiment, the refrigeration system is part of the WHR system and includes a refrigerant heat exchanger and the coolant chiller is connected to the refrigerant heat exchanger with a third cooling loop.

In one embodiment, the third cooling loop includes a compressor for compressing refrigerant from the coolant chiller and a flow control valve to selectively allow circulation of refrigerant in the third cooling loop in response to an ambient temperature condition greater than a threshold.

In one embodiment, the method includes positioning a second flow control valve connecting the second cooling loop to the first cooling loop to isolate the coolant in the second cooling loop in response to the ambient temperature condition being greater than the threshold for recirculation of the coolant in the second cooling loop. The method further includes positioning the second flow control valve to allow coolant flow from the first cooling loop, through the second cooling loop and the coolant chiller, and back to the first cooling loop in response to the ambient temperature condition being less than the threshold.

In one embodiment, the refrigeration system is part of a cabin refrigeration system for the vehicle.

The present disclosure further contemplates that an electronic control apparatus can be employed for operating the systems and/or for performing the methods disclosed herein.

While illustrative embodiments of the disclosure have been illustrated and described in detail in the drawings and foregoing description, the same is to be considered as illustrative and not restrictive in character, it being understood that only certain exemplary embodiments have been shown and described and that all changes and modifications that come within the spirit of the claimed inventions are desired to be protected. It should be understood that while the use of words such as preferable, preferably, preferred or more preferred utilized in the description above indicate that the feature so described may be more desirable, it nonetheless may not be necessary and embodiments lacking the same may be contemplated as within the scope of the invention, the scope being defined by the claims that follow. In reading the claims, it is intended that when words such as "a," "an," "at least one," or "at least one portion" are used there is no intention to limit the claim to only one item unless specifically stated to the contrary in the claim. When the language "at least a portion" and/or "a portion" is used the item can include a portion and/or the entire item unless specifically stated to the contrary. Non-limiting examples of what may be claimed in one or more non-provisional applications claiming priority to the present application include the following.

What is claimed is:

1. A cooling system for an electrified vehicle, the system comprising:
    a first cooling loop for circulating coolant for cooling at least one of power electronics and a motor/generator of the vehicle, wherein the first cooling loop includes a heat exchanger for exchanging heat with the coolant in the first cooling loop; and
    a second cooling loop for circulating coolant for cooling an energy storage device of the vehicle, wherein the second cooling loop includes a coolant chiller connected to a refrigeration system of the vehicle for exchanging heat in the coolant received from the energy storage device with the refrigeration system of the vehicle.

2. The cooling system of claim 1, wherein the heat exchanger is a radiator.

3. The cooling system of claim 1, wherein at least one of the first and second cooling loops includes a pump for circulating coolant.

4. The cooling system of claim 1, wherein each of the first and second cooling loops includes a pump for circulating coolant.

5. The cooling system of claim 1, wherein the heat exchanger is part of a waste heat recovery (WHR) system of the vehicle.

6. The cooling system of claim 5, wherein the second cooling loop is connected to the first cooling loop with a flow control valve, and the flow control valve is positionable to isolate the coolant in the second cooling loop in response to a first ambient temperature condition, and to allow coolant flow from the second cooling loop to the first cooling loop in response to a second ambient temperature condition.

7. The cooling system of claim 5, wherein the second cooling loop is completely separate from the first cooling loop.

8. The cooling system of claim 5, wherein the coolant in the first cooling loop is in thermal communication with a WHR refrigerant from the WHR system.

9. The cooling system of claim 5, wherein the refrigeration system is part of the WHR system and includes a refrigerant heat exchanger and the coolant chiller is connected to the refrigerant heat exchanger with a third cooling loop.

10. The cooling system of claim 9, wherein the third cooling loop includes a compressor for compressing refrigerant from the coolant chiller.

11. The cooling system of claim 9, wherein the third cooling loop includes a flow control valve to selectively allow circulation of refrigerant in the third cooling loop in response to an ambient temperature condition greater than a threshold.

12. The cooling system of claim 11, wherein the second cooling loop is connected to the first cooling loop with a second flow control valve, and the second flow control valve is positionable to isolate the coolant in the second cooling loop in response to the ambient temperature condition being greater than the threshold for recirculation of the coolant in the second cooling loop, and to allow coolant flow from the first cooling loop, through the second cooling loop and the coolant chiller, and back to the first cooling loop in response to the ambient temperature condition being less than the threshold.

13. The cooling system of claim 1, wherein the refrigeration system is part of a cabin refrigeration system for the vehicle.

14. A method for operating an electrified vehicle cooling system, comprising:
    circulating coolant in a first cooling loop to cool at least one of power electronics and a motor/generator of the vehicle, wherein the first cooling loop includes a heat exchanger for exchanging heat with the coolant in the first cooling loop; and
    circulating coolant in a second cooling loop to cool an energy storage device of the vehicle, wherein the second cooling loop includes a coolant chiller connected to a refrigeration system of the vehicle for exchanging heat in the coolant received from the energy storage device with the refrigeration system of the vehicle.

15. The method of claim 14, further comprising:
    positioning a flow control valve that connects the second cooling loop to the first cooling loop to isolate the coolant in the second cooling loop in response to a first ambient temperature condition; and
    positioning the flow control valve to allow coolant flow from the second cooling loop to the first cooling loop in response to a second ambient temperature condition.

16. The method of claim 15, wherein the second cooling loop is completely separate from the first cooling loop, and the coolant in the first cooling loop is in thermal communication with a waste heat recovery (WHR) refrigerant from a WHR system of the vehicle.

17. The method of claim 16, wherein the refrigeration system is part of the WHR system and includes a refrigerant heat exchanger and the coolant chiller is connected to the refrigerant heat exchanger with a third cooling loop.

18. The method of claim 17, wherein the third cooling loop includes:

a compressor for compressing refrigerant from the coolant chiller; and a flow control valve to selectively allow circulation of refrigerant in the third cooling loop in response to an ambient temperature condition greater than a threshold.

19. The method of claim 18, further comprising:

positioning a second flow control valve connecting the second cooling loop to the first cooling loop to isolate the coolant in the second cooling loop in response to the ambient temperature condition being greater than the threshold for recirculation of the coolant in the second cooling loop; and positioning the second flow control valve to allow coolant flow from the first cooling loop, through the second cooling loop and the coolant chiller, and back to the first cooling loop in response to the ambient temperature condition being less than the threshold.

20. The method of claim 14, wherein the refrigeration system is part of a cabin refrigeration system for the vehicle.

* * * * *